United States Patent
Hughes

(10) Patent No.: US 9,100,536 B2
(45) Date of Patent: Aug. 4, 2015

(54) IMAGING DEVICE AND METHOD

(71) Applicant: Sony Computer Entertainment Europe Limited, London (GB)

(72) Inventor: Colin Jonathan Hughes, London (GB)

(73) Assignee: Sony Computer Entertainment Europe Limited (GB)

(*) Notice: Subject to any disclaimer, the term of this patent is extended or adjusted under 35 U.S.C. 154(b) by 127 days.

(21) Appl. No.: 14/043,993

(22) Filed: Oct. 2, 2013

(65) Prior Publication Data

US 2014/0098184 A1 Apr. 10, 2014

(30) Foreign Application Priority Data

Oct. 4, 2012 (GB) .................................. 1217777.0

(51) Int. Cl.
| | |
|---|---|
| *G09G 5/00* | (2006.01) |
| *H04N 7/14* | (2006.01) |
| *H04N 5/335* | (2011.01) |
| *H01L 27/146* | (2006.01) |
| *G06F 3/041* | (2006.01) |
| *G06F 3/042* | (2006.01) |

(52) U.S. Cl.
CPC .............. *H04N 7/144* (2013.01); *G06F 3/0412* (2013.01); *G06F 3/0421* (2013.01); *H01L 27/14621* (2013.01); *H04N 5/335* (2013.01)

(58) Field of Classification Search
CPC ............ H01L 27/14621; G06F 3/0421; G06F 3/0412
USPC .......................................... 345/612, 613, 175
See application file for complete search history.

(56) References Cited

U.S. PATENT DOCUMENTS

| | | | |
|---|---|---|---|
| 2002/0044208 A1 | 4/2002 | Yamazaki et al. | |
| 2004/0140973 A1 | 7/2004 | Zanaty | |
| 2004/0263670 A1* | 12/2004 | Yamasaki | ...................... 348/340 |
| 2006/0279557 A1* | 12/2006 | Gettemy | ....................... 345/175 |
| 2007/0002130 A1 | 1/2007 | Hartkop | |

(Continued)

FOREIGN PATENT DOCUMENTS

| | | |
|---|---|---|
| EP | 2338274 A2 | 6/2011 |
| EP | 2339830 A2 | 6/2011 |

(Continued)

OTHER PUBLICATIONS

Extended European Search Report for Application No. 13186827.5 dated Mar. 13, 2014.

(Continued)

*Primary Examiner* — Creighton Smith
(74) *Attorney, Agent, or Firm* — Lerner, David, Littenberg, Krumholz & Mentlik, LLP

(57) ABSTRACT

A display is disclosed that comprises an array of display pixels, in which light sensing pixels are interspersed with the display pixels substantially across the area of the display. At least one color display sub-pixel is arranged to be switched off when the corresponding color light sensor pixel closest to that display sub-pixel is detecting light to generate an image. A portable electronic device is disclosed which comprises the display. The display is then operable to capture an image from the light sensing pixels, so that for example it can then operate as one or more of a digital mirror, scanner, biometric lock or touch panel. When a user looks at the display for a video call, the captured image of the user appears to look directly the other party.

15 Claims, 8 Drawing Sheets

(56) References Cited

U.S. PATENT DOCUMENTS

2010/0314631 A1 12/2010 Ludwig
2012/0002090 A1 1/2012 Aoki et al.

FOREIGN PATENT DOCUMENTS

| | | |
|---|---|---|
| GB | 2439118 A | 12/2007 |
| JP | 2009016855 A | 1/2009 |
| WO | 2010033175 A2 | 3/2010 |

OTHER PUBLICATIONS

British Search Report for Application No. GB 1217777 dated Apr. 9, 2013.

* cited by examiner

IMAGING DEVICE AND METHOD

CROSS REFERENCE TO RELATED APPLICATIONS

The present application claims the benefit of and priority to GB Application No. 1217777.0, filed Oct. 4, 2012, the entire disclosure of which is incorporated by reference herein.

BACKGROUND OF THE INVENTION

1. Field of the invention

The present invention relates to an imaging device and method.

2. Description of the Prior Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Conventional devices such as mobile phones and tablet computers frequently comprise one or more cameras. These cameras are generally used for taking photographs or for making video calls.

One issue with video calls is that often neither user will appear to be looking at the other. This is because in order to appear to be looking at the other party, a user must look at the camera rather than at the screen where the other party is being displayed on-screen. Generally, most users will either just look at the display, or alternate between display and camera. Neither is a very satisfactory approach and results in an unnatural appearance or behaviour of the user.

One way to mitigate this effect is to display the user's own image in a small window on the display, so that they become aware of their appearance and can adapt it if they wish.

Another approach is to position video cameras on either side of the display; in this case when the user looks at the display, an interpolated image of the user may be generated from both images to produce an image in which the user appears to be facing a virtual camera positioned centrally within the display. However, this is relatively wasteful of computing resources and hence battery life, and also requires a second camera that is used potentially only for this purpose, which adds cost.

Hence it is still desirable to provide a means to mitigate this effect.

SUMMARY OF THE INVENTION

In a first aspect, a display device is provided in accordance with claim 1. In another aspect an imaging method is provided in accordance with claim 15. Further respective aspects and features of the invention are defined in the appended claims.

It is to be understood that both the foregoing general description of the invention and the following detailed description are exemplary, but are not restrictive, of the invention.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

An imaging device and method are disclosed. In the following description, a number of specific details are presented in order to provide a thorough understanding of the embodiments of the present invention. It will be apparent, however, to a person skilled in the art that these specific details need not be employed to practise the present invention. Conversely, specific details known to the person skilled in the art are omitted for the purposes of clarity where appropriate.

Figure 1:
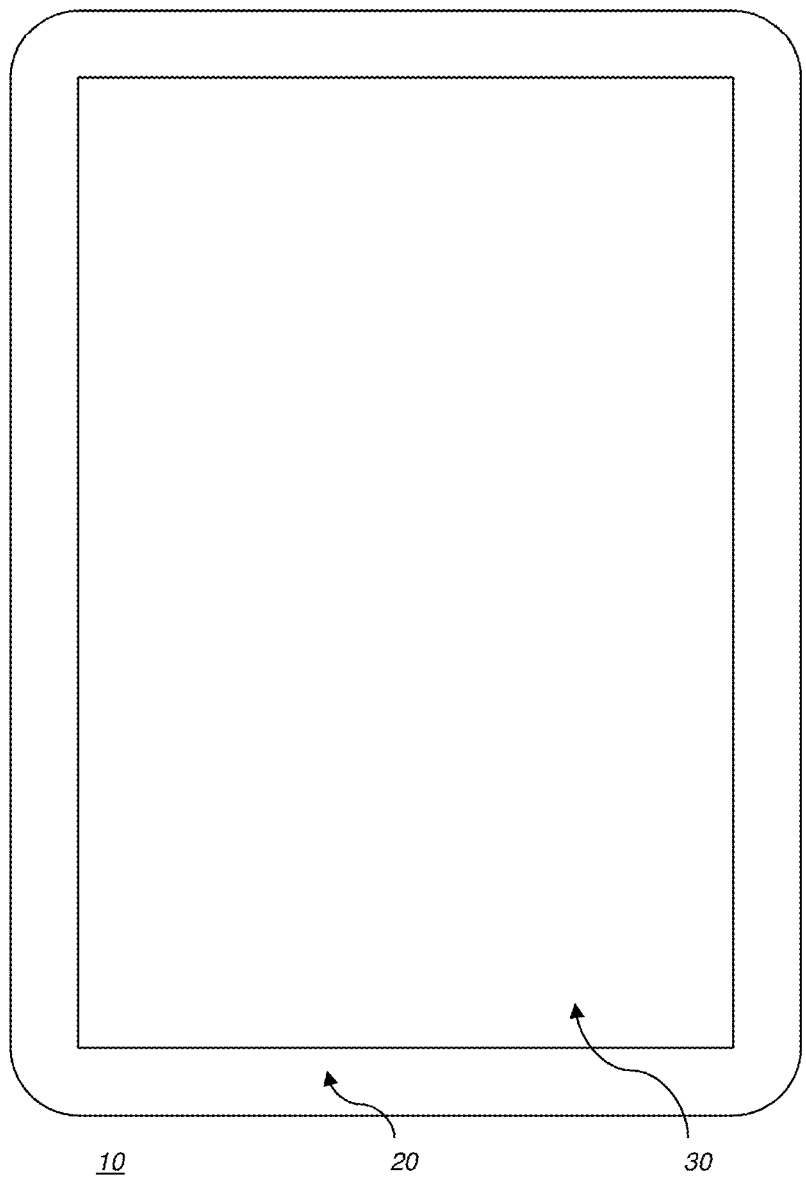
FIG. 1 is a schematic diagram of a portable electronic device in accordance with an embodiment of the present invention.

Referring to FIG. 1, in an embodiment of the present invention a portable device 10, such as a tablet computer, PDA, media player and/or mobile phone, comprises a housing 20 and a display 30.

The display may be an LCD, OLED, e-ink or other suitable display for such devices. For a colour display, then for each pixel a number of sub-pixel arrangements are known for the red, green and blue elements that comprise a pixel (as are patterns where a yellow element is also included).

Figure 2:
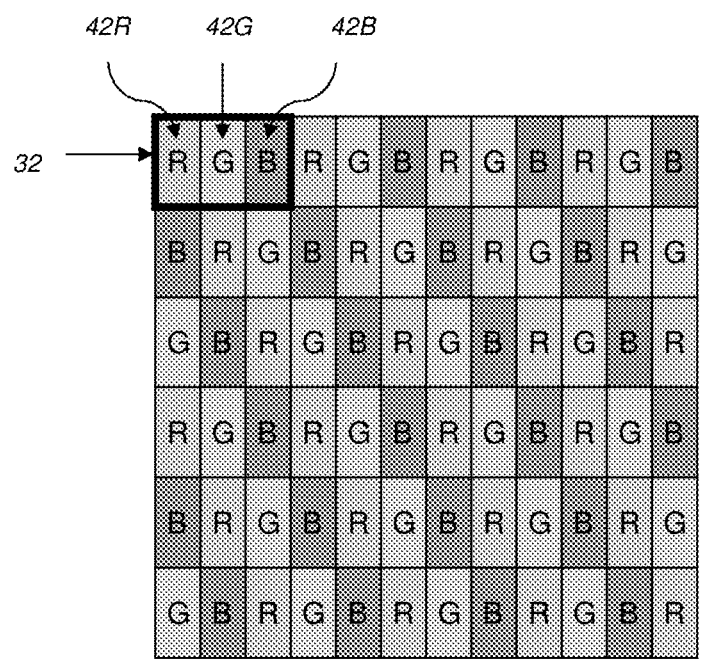
FIG. 2 is a schematic diagram of a conventional display pixel and display sub-pixel layout.

FIG. 2 illustrates a typical pixel (32) and a sub-pixel arrangement of RGB display elements (42R,G,B) found in such displays.

Referring now to FIGS. 3A-D, in an embodiment of the present invention the substrate supporting one or more elements of a display pixel also supports one or more sensor pixels (52) of a charge coupled device (CCD). A sensor pixel of a CCD accumulates an electric charge proportional to the intensity of light at the device's photoactive region, before the charge is converted into an output voltage for subsequent digitisation. Separate red, green and blue channels may be produced by coating CCD sub-pixels with appropriate dyes or using other known techniques.

As a result of embedding at least one sensor pixel in association with each display pixel, the complete display surface (or a substantial part thereof) also becomes a distributed CCD sensor for imaging purposes, with light sensing pixels interspersed between display pixels across all (or some) of the area of the display.

Figure 3A:
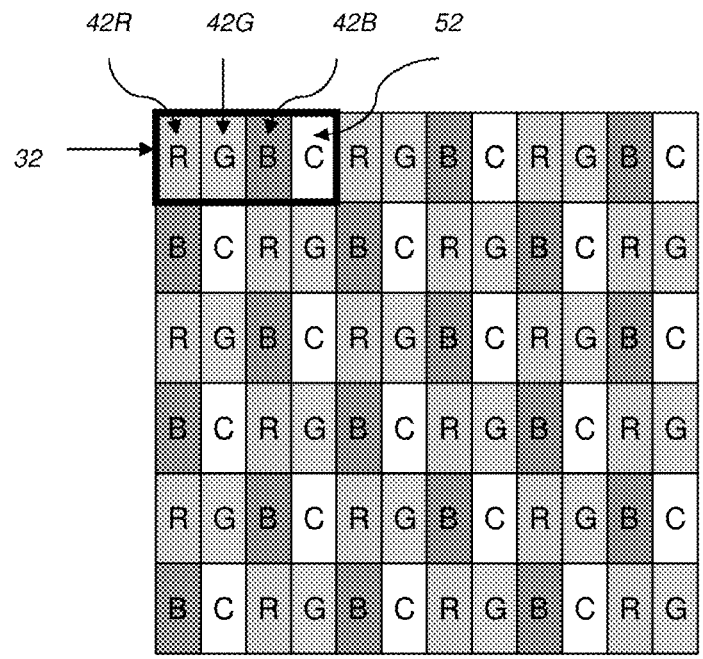
FIGS. 3A-D are schematic diagrams of display pixel and display sub-pixel and light sensor pixel layouts in accordance with an embodiment of the present invention.

In FIG. 3A, a sensor pixel C (52) is incorporated into the pattern of the display so that there is one sensor pixel per display pixel (a display pixel comprising one red, green and blue sub-pixel element 42R,G,B as noted above). In FIG. 3A, the sensor pixel occupies an area equivalent to one sub-pixel element.

As noted above, the sensor pixel itself may have its own red, green and blue sub-pixel sensors, and these can all fit within the space of a display sub-pixel; it will be appreciated that typical CCD's have a much smaller dot pitch than typical displays, and hence all three sensor sub-pixels can be accommodated in a region equivalent to one display sub-pixel or less.

However, when compared to FIG. 2, the arrangement shown in FIG. 3A would adversely affect both the available resolution and brightness of the display.

Figure 3B:
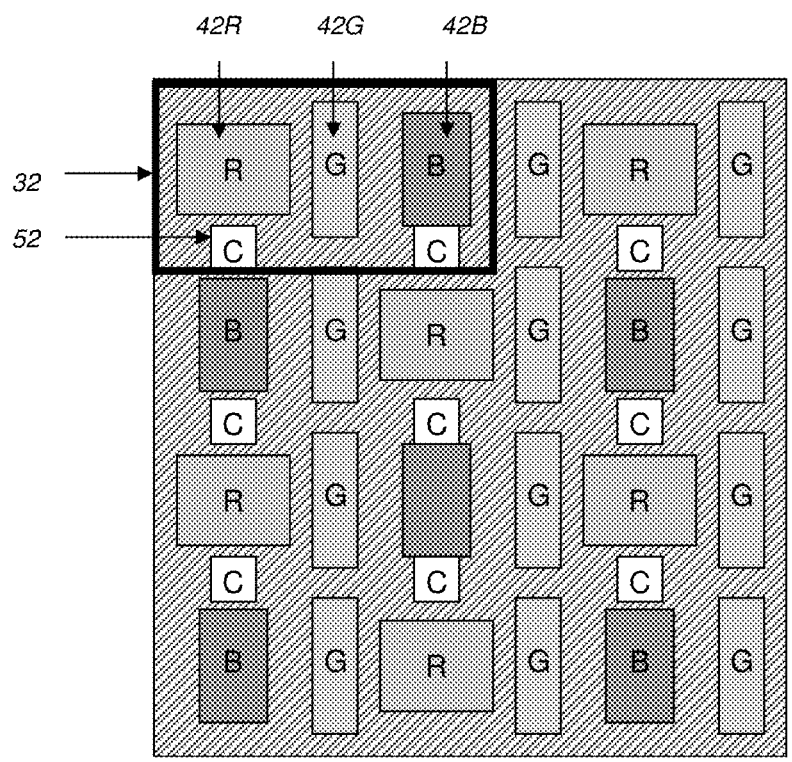

However, referring now to FIG. 3B, in practice many displays have sub-pixel patterns that comprise non-illuminated spaces. FIG. 3B illustrates an RGBG pattern of the PenTile Matrix family of sub-pixel patterns used in some smart phones, and which has a relatively large amount of space between pixels. In such a case, the CCD sensor pixels can be distributed within these spaces, for example in the manner shown. In this way, the provision of the distributed CCD sensor need not affect the original brightness of the display.

Figure 3C:
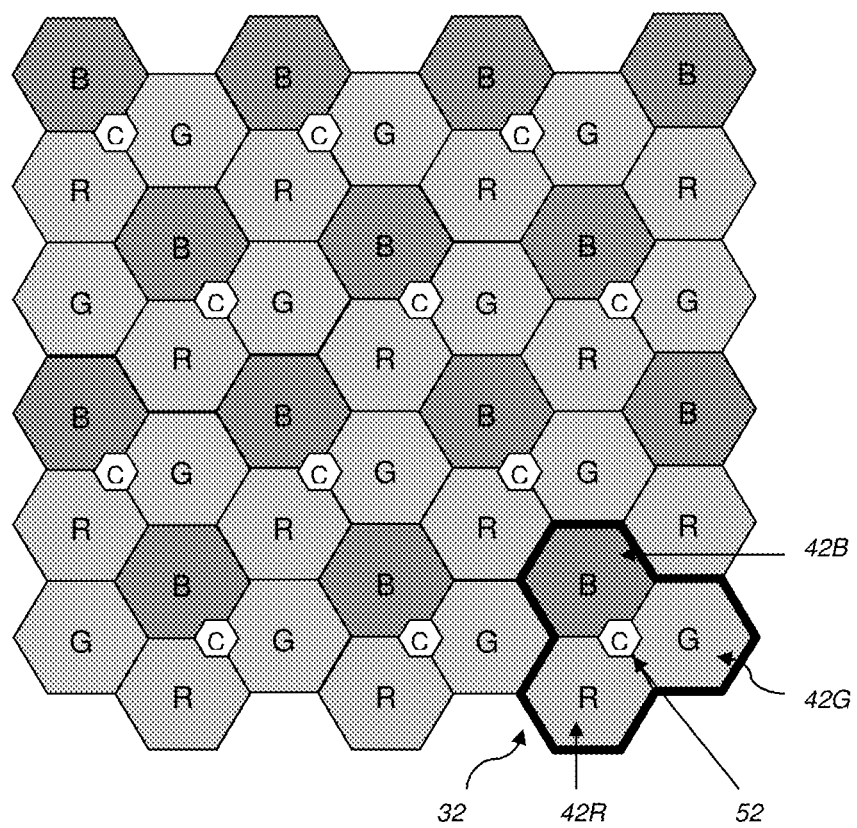

Referring now to FIG. 3C, in another embodiment the CCD sensors may be positioned within the pixel 32 to partially overlap or replace small elements of the sub-pixels. Because it is possible to use CCD sensor pixels that are small relative to the sub-pixels of the display, the impact on overall display brightness is small, and of course may be reduced further if the CCD sensor pixel can be fabricated on an unused section of the substrate or one used by the display pixel for control, switching or other non-illumination functions.

Figure 3D:
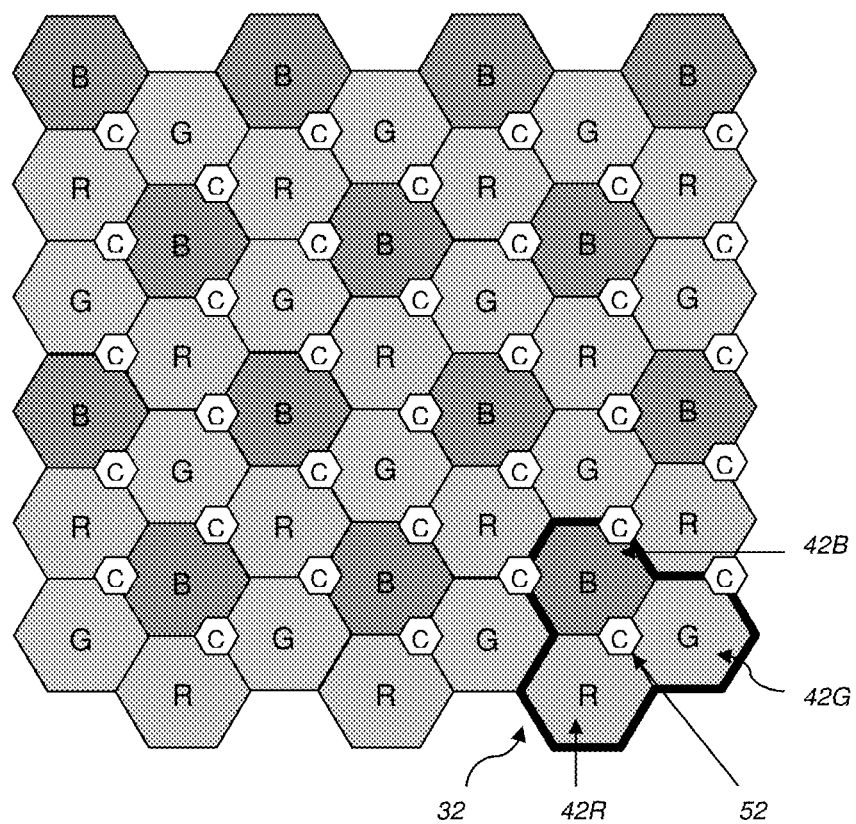

Finally, referring to FIG. 3D, it will be appreciated that the density of CCD sensor pixels can be higher than the density of display pixels, so that the resolution of the captured image is higher than the display resolution. For example in FIG. 3D, the image capture resolution is three times that of the display resolution. In general, because of the regular arrangement of display sub-pixels, one may expect that the image capture resolution will be an integer multiple of the display resolution.

In any of the above cases, the result is a discontinuous array of sensor pixels, or a discontinuous CCD sensor, distributed over substantially the same area as the display itself.

Consequently it will be appreciated that unlike a conventional camera, the distributed sensor as a whole will not be optically coupled to a lens (the flat bezel of the display itself is normally intended to be optically neutral and does not have a useful lensing or focussing effect over its area, and so is not considered to be a lens).

Hence to obtain an improved image from the distributed sensor, in an embodiment of the present invention the sensor pixels are recessed in the display to provide light from a limited field of view centred directly in front of the sensor pixel. This approach is similar to that used in compound eyes by insects, where an image is formed by limiting the field of view of each generated sub-image to a very small angle, so that the proportion of the field of view to which each sub-image is exposed is roughly equal to (or within an order of magnitude of) the proportion of the overall image to which that sub-image contributes.

Alternatively or in addition, micro lenses or wave guides and other optical techniques may be employed to limit the amount of incident light reaching a sensor that did not arrive in a direction substantially normal to the sensor itself. It will be appreciated that such lenses, guides and so forth may be larger than the sensor; for example, where the sensor is of limited size due to the layout requirements of the display pixel and sensor pixel on the same substrate, an electrically neutral lens or waveguide may overlay non-imaging and non-display electronics as well as the sensor pixel, to capture light over a larger area and so improve sensitivity.

Figure 4A:
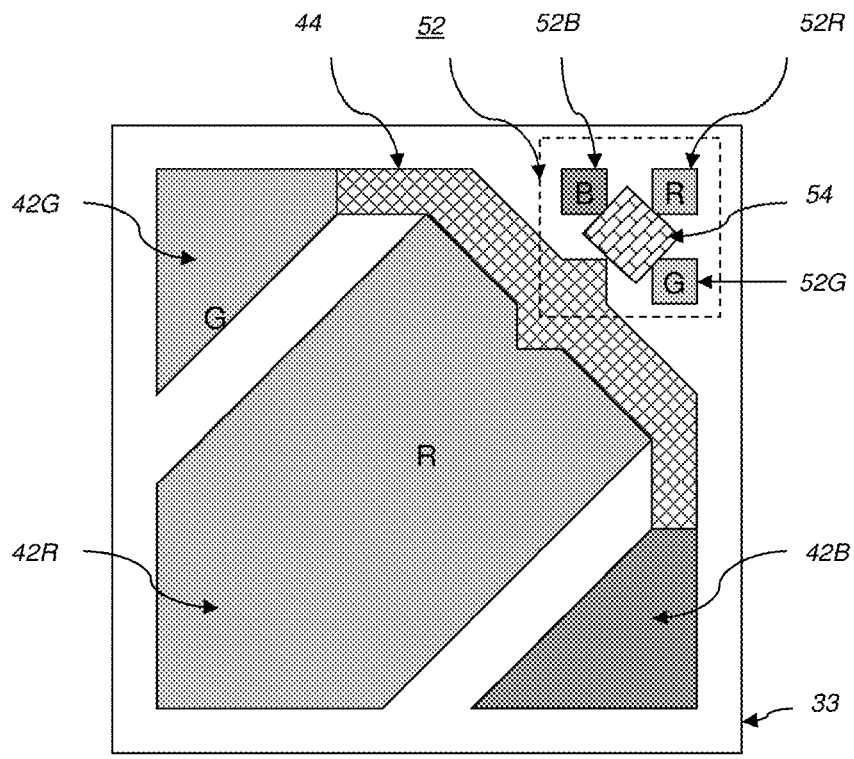
FIGS. 4A-C are schematic diagrams of a pixel comprising display sub-pixels and light sensor sub-pixels in accordance with an embodiment of the present invention.

Referring now FIG. 4A, this illustrates another example arrangement of a pixel (32) on a substrate (33). Like FIG. 3B, this exploits people's different sensitivities to green, blue and red light to use different sized sub-pixel colour emitters (42R, G,B). In addition, there may be non-emitting electronics 44 associated with the sub-pixel emitters, for example to drive the sub-pixels and/or switch them on. In a region of remaining space on the pixel, the sensor pixel (52) comprises sensor sub-pixels (52R,G,B). In addition there may be non-sensing electronics (54) associated with these sensor sub-pixels, for example to convert charge to voltage and output the results, and optionally some of these electronics or their connectors may be in common with those of the display pixel, as appropriate.

In an embodiment of the present invention, the non-emitting electronics serves in part to shield the sensor pixels from the light emitted by the display pixels. Non-light-emitting (and non-sensing) areas of the pixel may also be coated with additional layers of material to act as further light shielding between display and sensor pixels. In addition it will be appreciated that if the sensor sub-pixels are recessed with respect to the display sub-pixels, this will also provide some light shielding.

Figure 4B:
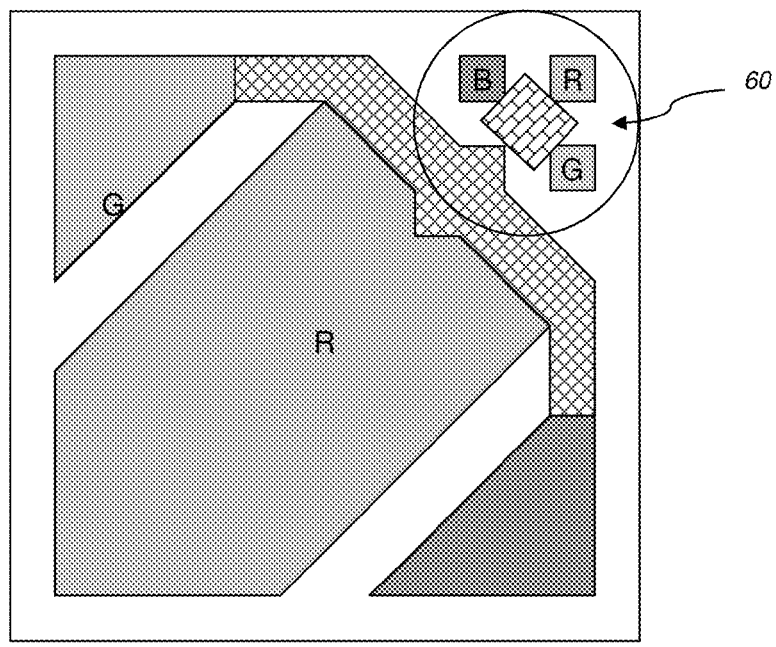

Referring to FIG. 4B, which shows the same pixel arrangement as FIG. 4A, in an embodiment of the present invention the pixel assembly also comprises a lens or waveguide 60 as described previously, overlaying the sensor pixel and having a larger area than the photoactive regions of the sensor pixel, enabling more light to be channelled to these photoactive regions and consequently improving effective sensitivity.

Figure 4C:
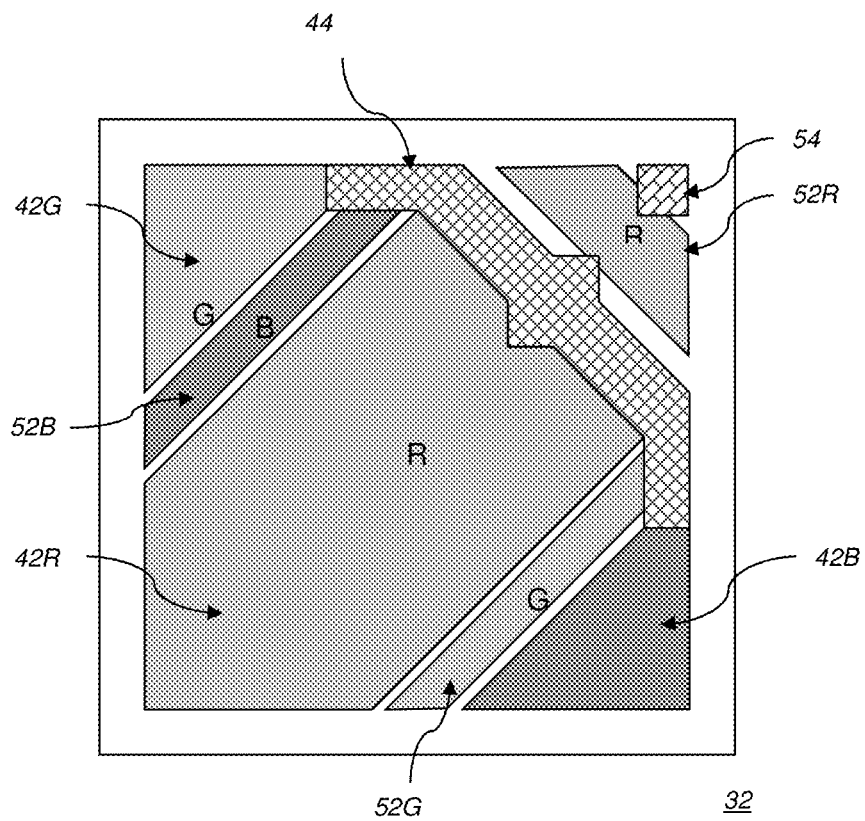

Referring finally also to FIG. 4C, the photoactive regions of the sensor sub-pixels need not be adjacent or contiguous or all located in one region of the combined pixel, but may be positioned between display sub-pixels, as shown in FIG. 4C. Here, to reduce cross-talk or light bleed from the display sub-pixels to the sensor sub-pixels, at least one sensor sub-pixel sensitive to a first colour can be positioned between display sub-pixels of two other different colours. Hence in FIG. 5C, the blue sensor sub-pixel is positioned between the green and red display sub-pixels whilst the green sensor sub-pixel is positioned between the blue and red display sub-pixels. Meanwhile the red sensor sub-pixel uses a mixture of distance and shielding from the red display pixel as described previously, and/or may be recessed (or recessed further) within the substrate.

By separating the sensor sub-pixels in this manner, then in some display pixel arrangements it is possible to use larger sensor sub-pixels, enabling greater sensitivity.

As noted above with the example of FIG. 4C, any suitable mixture of complementary colour positioning, distance, recess and light shielding can be used to reduce the cross-talk between emitted light and detected light in the system.

In addition, a duty cycle can be used to switch light emitters off when nearby sensors are detecting light. Again this can be done on a per-pixel basis or on a corresponding colour sub-pixel basis, so that for example a red light emitter turns off for the fraction of a second in which a red light sensor detects light.

Finally, if light still bleeds from the display to the sensors (for example due to backscatter from the bezel), then the device can also record to a memory the state of the displayed image at the moment that a captured image is recorded, and based upon empirically determined parameters, subtract a proportion of the displayed image from the captured image to substantially remove its effect on the captured image. In this way any ghost version of the displayed image within the captured image can be substantially removed digitally.

The final result is an image captured over the area of the display using a sparsely distributed CCD whose sensors are interspersed with the display pixels.

Applications for a device able to capture such an image include operating as a digital mirror, so that a user can see themselves when they look at the screen (and with suitable software, to optionally modify their reflected image, for example to test choices of make-up).

Another application is as a flat scanner; a piece of paper may be placed on the device and scanned, using the display as illumination. In the case where only a monochrome light sensor pixel is used (i.e. generating a greyscale image) then colour scanning is still possible by selectively illuminating the paper using the red, green and blue display sub-pixels, and combining the resulting scans.

A further application is as a biometric lock for the device; a user's hand, palm or fingers may be scanned in a similar manner, and used to determine if they correspond to a user who is authorised to access additional functionality of the device, for example using template matching or other known robust image recognition techniques.

In principle, the CCD could also be used in place of a touch-sensitive layer on the bezel; by estimating where a user's finger (or fingers) or a stylus are positioned within the captured image, then using known image analysis techniques the corresponding position on the display can be determined. By tracking the user's finger(s) or stylus over time, then in addition gestural inputs can be recognised.

Thus the CCD can provide a camera function, but optionally can also provide one or more of a digital mirror, scanner, biometric lock and touch screen function as well.

In addition, of course, it also means that when a user is on a video call and looks at the other person on the display, they are also looking directly at the camera—and so they will appear to be looking directly at the other person when the captured image is displayed to the other person, as is desired.

It will be appreciated that references herein to CCD sensors may be understood to encompass any suitable image sensing technology, such as CMOS sensors.

Hence, in a summary embodiment of the present invention, a display (30) comprises an array of display pixels (32), and light sensing pixels (52) are interspersed with the display pixels substantially across the area of the display. The display is then operable to capture an image from the light sensing pixels in a manner similar to conventional digital cameras, but using a dispersed, non-contiguous sensor array, and without using a single lens or lens assembly in front of that sensor array (typically also of comparable size or larger than the array, and also having considerable depth).

In an instance of the summary embodiment, a portable electronic device (10) such as a tablet, smartphone, or portable games device, comprises a housing (20) and the display.

In an instance of the summary embodiment, then as noted previously the portable electronic device is operable to display the captured image on the display, thereby operating as a mirror.

In another instance of the summary embodiment, then as noted previously the portable electronic device is operable to scan an object placed on the display surface. Optionally, if the light sensing pixels are greyscale, then the portable electronic device is operable to successively scan the object using each respective colour of sub-pixel in the display (for example red, then green, then blue, to for a red-light scan, a green-light scan and a blue-light scan), and then combine these resulting scans to form a full colour scan.

In another instance of the summary embodiment, then as noted previously the portable electronic device is operable to capture an image of part of a user (for example a hand, palm, or one or more fingertips) using the light sensing pixels, and to selectively provide access to at least a first function in dependence upon whether the captured image of part of the user corresponds to a reference image of part of the user. The comparison may use the images directly or some processed representation such as an eigenvector or other abstraction.

In another instance of the summary embodiment, then as noted previously the portable electronic device is operable to capture an image using the light sensing pixels, and to detect the or each position at which an object in the image is touching the display. Subsequently, the portable electronic device can modify the operation of a function of the device (for example the position of a pointer on the display) in response to one or more detected positions of such a detected object.

In another instance of the summary embodiment, then as noted previously the portable electronic device comprises a memory for storing the displayed image, and an image processing apparatus operable to delete from the captured image a processed version of the displayed image.

In another instance of the summary embodiment, then as noted previously the display comprises display pixels that in turn comprise red, green and blue display sub-pixels (42R,G, B); and also comprises light sensing pixels that in turn comprise red, green and blue sensor sub-pixels (52R,G,B). In this case then as noted previously optionally at least one sensor sub-pixel of one colour is positioned substantially between display sub-pixels of the other two colours, so reducing cross-talk between the sensor sub-pixel and the two display sub-pixels.

In another instance of the summary embodiment, then as noted previously the display comprises pixels on which a proportion of the non-light-emitting and non-light-sensing surface area of the combined pixel (comprising a display pixel and at least one light sensing pixel) is arranged to reduce the passage of light across that surface area, i.e. to operate as a light shield.

In another instance of the summary embodiment, then as noted previously microlenses are positioned substantially over respective light sensing pixels. These microlenses (or equivalent waveguides) may have an effective surface area larger than the light sensing pixels themselves.

In another instance of the summary embodiment, then as noted previously at least one light sensing sub-pixel is recessed with respect to the display pixel(s) it is most closely associated with.

In another instance of the summary embodiment, then as noted previously, at least one colour display sub-pixel is switched off when the corresponding colour light sensor pixel closest to that display sub-pixel is detecting light to generate an image. By using such complementary duty cycles for image display and capture, either at the sub-pixel level or at the pixel level, then cross-talk between the display and the captured image is significantly reduced.

Figure 5:
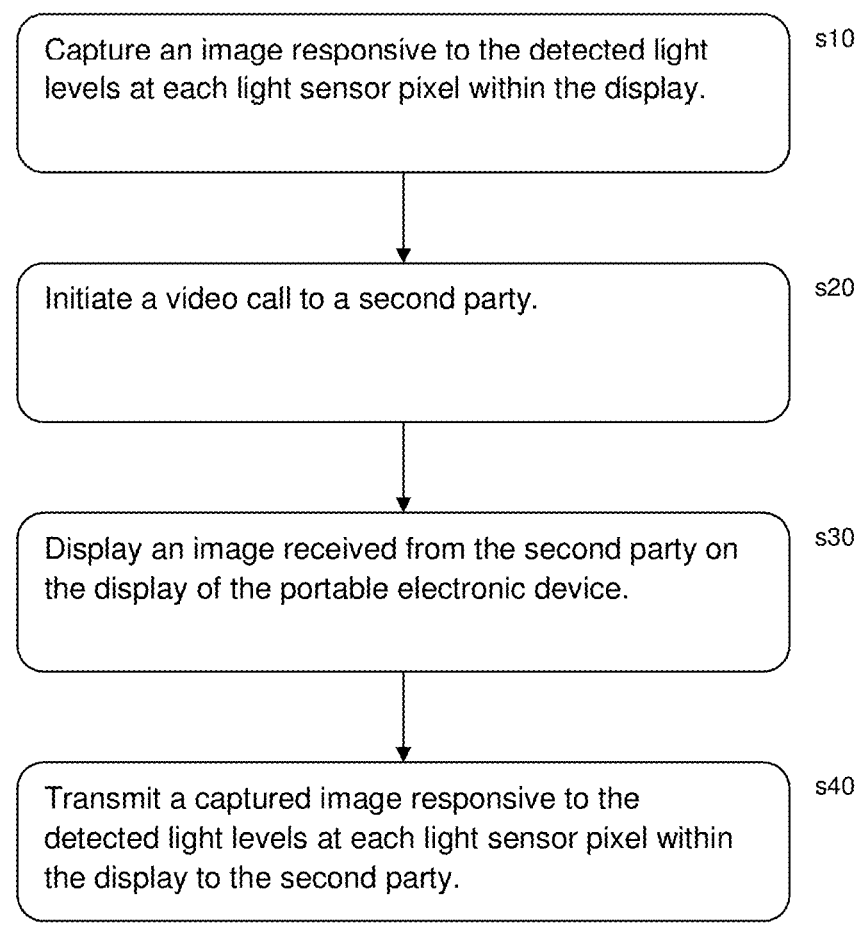
FIG. 5 is a flow diagram of an imaging method in accordance with an embodiment of the present invention.

Referring now to FIG. 5, an imaging method for a display that comprises an array of display pixels, and in which light sensing pixels are interspersed with the display pixels substantially across the area of the display, comprises:

- in a first step s10, capturing an image responsive to the detected light levels at each light sensor pixel within the display.

Further optional steps include:

- in a second step s20, initiating a video call to a second party;
- in a third step s30 displaying an image received from the second party on the display of the portable electronic device; and
- in a fourth step s40, transmitting a captured image responsive to the detected light levels at each light sensor pixel within the display to the second party.

It will be appreciated that when implemented in conjunction with the above optional steps, the first step may occur after the second or third step as applicable.

It will be apparent to a person skilled in the art that variations in the above method corresponding to operation of the various embodiments of the apparatus as described and claimed herein are considered within the scope of the present invention, including but not limited to:

- using the display and diffused light sensors as one or more of a digital mirror, scanner, biometric lock and touch surface;
- positioning display sub-pixels and sensor sub-pixels in a complementary manner to reduce cross-talk on respective colour channels; and
- Using complementary duty cycles either at the-pixel or respective sub-pixel level for the display and sensor elements to reduce cross-talk.

It will be appreciated that the methods disclosed herein may be carried out on conventional hardware suitably adapted as applicable by software instruction or by the inclusion or substitution of dedicated hardware.

Thus the required adaptation to existing parts of a conventional equivalent device may be implemented in the form of a non-transitory computer program product or similar object of manufacture comprising processor implementable instructions stored on a data carrier such as a floppy disk, optical disk, hard disk, PROM, RAM, flash memory or any combination of these or other storage media, or realised in hardware as an ASIC (application specific integrated circuit) or an FPGA (field programmable gate array) or other configurable circuit suitable to use in adapting the conventional equivalent device. Separately, if applicable the computer program may take the form of a transmission via data signals on a network such as an Ethernet, a wireless network, the Internet, or any combination of these or other networks.

The foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A display, comprising:
an array of display pixels;
and in which
light sensing pixels are interspersed with the display pixels substantially across the area of the display; and
at least one colour display sub-pixel is arranged to be switched off when a corresponding colour light sensing pixel closest to that colour display sub-pixel is detecting light to generate an image.

2. A portable electronic device, comprising
a display according to claim 1; and
a housing, and in which
the portable electronic device is operable to capture an image from the light sensing pixels.

3. The portable electronic device according to claim 2, configured to display the captured image on the display, thereby operating as a mirror.

4. The portable electronic device according to claim 2, configured to scan an object placed on a surface of the display.

5. The portable electronic device according to claim 4, in which if the light sensing pixels are greyscale, then the portable electronic device is configured to successively scan the object using each respective colour of sub-pixel in the display, and then combine the resulting scans to form a colour scan.

6. The portable electronic device according to claim 2, configured to capture an image of part of a user using the light sensing pixels, and to selectively provide access to at least a first function in dependence upon whether the captured image of part of the user corresponds to a reference image of part of the user.

7. The portable electronic device according to claim 2, configured to capture an image using the light sensing pixels, and detect a position at which an object in the image is touching the display.

8. The portable electronic device according to claim 7, in which operation of a function of the device is modified in response to one or more detected positions of the object.

9. The portable electronic device according to claim 2, comprising
a memory for storing the displayed image; and
an image processing apparatus operable to delete from the captured image a processed version of the displayed image.

10. A display according to claim 1, in which:
the display pixels comprise red, green and blue display sub-pixels; and
the light sensing pixels comprise red, green and blue sensor sub-pixels;
and in which at least one sensor sub-pixel of one colour is positioned substantially between display sub-pixels of the other two colours.

11. A display according to claim 1, in which:
microlenses are positioned substantially over respective light sensing pixels.

12. A display according to claim 1, in which:
at least one light sensing sub-pixel is recessed with respect to the display pixels.

13. An imaging method for a display that comprises an array of display pixels, and in which light sensing pixels are interspersed with the display pixels substantially across an area of the display, the method comprising:
capturing an image responsive to detected light levels at each light sensor pixel within the display; wherein the step of capturing an image comprises
switching off at least one colour display sub-pixel when a corresponding colour light sensor pixel closest to that display sub-pixel is detecting light to capture the image.

14. The imaging method according to claim 13 for a portable electronic device comprising a housing and the display, the method comprising the steps of:
initiating a video call to a second party;
displaying an image received from the second party on the display of the portable electronic device; and
transmitting a captured image responsive to the detected light levels at each light sensor pixel within the display to the second party.

15. A non-transitory computer program product comprising processor implementable instructions that when implemented on a computer cause the computer to carry out an imaging method for a display that comprises an array of display pixels, and in which light sensing pixels are interspersed with the display pixels substantially across the area of the display, the method comprising:
capturing an image responsive to detected light levels at each light sensor pixel within the display; wherein the step of capturing an image comprises switching off at least one colour display sub-pixel when a corresponding colour light sensor pixel closest to that display sub-pixel is detecting light to capture the image.

* * * * *